(12) United States Patent
Nakano et al.

(10) Patent No.: US 6,903,488 B2
(45) Date of Patent: Jun. 7, 2005

(54) SAW DEVICE AND MANUFACTURING METHOD

(75) Inventors: Masahiro Nakano, Tokyo (JP); Shigeki Ohtsuka, Tokyo (JP)

(73) Assignee: TDK Corporation, Tokyo (JP)

(*) Notice: Subject to any disclaimer, the term of this patent is extended or adjusted under 35 U.S.C. 154(b) by 103 days.

(21) Appl. No.: 10/251,811

(22) Filed: Sep. 23, 2002

(65) Prior Publication Data

US 2003/0067369 A1 Apr. 10, 2003

(30) Foreign Application Priority Data

Sep. 21, 2001 (JP) ........................................ 2001-289293

(51) Int. Cl.⁷ .............................................. H01L 41/08
(52) U.S. Cl. .................................. 310/313 A; 310/364
(58) Field of Search ..................... 310/313 R, 313 A, 310/360, 364

(56) References Cited

U.S. PATENT DOCUMENTS

| | | | |
|---|---|---|---|
| 5,152,864 A | | 10/1992 | Ieki et al. |
| 5,162,690 A | | 11/1992 | Ieki et al. |
| 5,171,642 A | | 12/1992 | DeHaven et al. |
| 5,279,985 A | | 1/1994 | Kamiyama |
| 5,352,622 A | * | 10/1994 | Chung .................... 438/396 |
| 5,558,711 A | | 9/1996 | Sakurai |
| 6,316,860 B1 | * | 11/2001 | Kimura et al. .......... 310/313 A |
| 6,377,138 B1 | * | 4/2002 | Takagi et al. ................ 333/193 |
| 6,626,026 B2 | * | 9/2003 | Banda et al. ............... 73/24.01 |
| 6,661,313 B2 | * | 12/2003 | Naumenko et al. ......... 333/193 |
| 6,677,696 B1 | * | 1/2004 | Ruile ...................... 310/313 A |

FOREIGN PATENT DOCUMENTS

| | | |
|---|---|---|
| EP | 0 785 299 | 7/1997 |
| EP | 1 111 779 | 6/2001 |
| JP | 55-49014 | 4/1980 |
| JP | 59-55615 | 3/1984 |
| JP | 64-80113 | 3/1989 |
| JP | 1-128607 | 5/1989 |
| JP | 4-10625 | 1/1992 |
| JP | 5-90268 | 4/1993 |
| JP | 5-183373 | 7/1993 |
| JP | 5-199062 | 8/1993 |
| JP | 5-226337 | 9/1993 |
| JP | 6-132777 | 5/1994 |
| JP | 7-122961 | 5/1995 |
| JP | 7-135443 | 5/1995 |
| JP | 7-107967 | 11/1995 |
| JP | 8-154030 | 6/1996 |
| JP | 8-204483 | 8/1996 |
| JP | 2545983 | 10/1996 |
| JP | 2555072 | 11/1996 |
| JP | 8-288782 | 11/1996 |
| JP | 9-199969 | 7/1997 |
| JP | 9-298442 | 11/1997 |
| WO | WO 97/11526 | 3/1997 |
| WO | WO 00/54005 | 10/1999 |

OTHER PUBLICATIONS

J. I. Latham, et al., Thin Solid Films, vol. 64, pp. 9–15, "Improved Metallization for Surface Acoustic Wave Devices", 1979.

(Continued)

Primary Examiner—Mark Budd
(74) Attorney, Agent, or Firm—Oblon, Spivak, McClelland, Maier & Neustadt, P.C.

(57) ABSTRACT

In a SAW device comprising a piezoelectric single crystal substrate and electrodes on a surface thereof, the substrate is obtained by slicing a $LiTaO_3$ or $LiNbO_3$ material such that a plane containing axis X and perpendicular to a new axis Y obtained by rotating axis Y about axis X by an angle of $33°\pm9°$ becomes the substrate surface, and each electrode is a layered film including a titanium nitride layer and an aluminum layer thereon. The aluminum layer containing no grain boundaries ensures high efficiency, long life SAW devices experiencing no increase of electrical resistance.

8 Claims, 4 Drawing Sheets

OTHER PUBLICATIONS

A. Kamijo, et al., J. Appl. Phys., vol. 77, No. 8, pp. 3799–3804, "A Highly Oriented Al[111] Texture Developed on Ultrathin Metal Underlayers", Apr. 15, 1995.

A. Sakurai, et al., Jpn. J. Appl. Phys., vol. 31, Part 1, No. 9B, pp. 3064–3066, "Epitaxially Grown Electrodes for High–Power Surface Acoustic Wave Devices", Sep. 1992.

Sakurai, et al., Jpn. J. Appl. Phys., vol. 33, Part 1, No. 5B, pp. 3015–3017, "Epitaxially Grown Aluminum Film on 36°–Rotated Y–Cut Lithium Tantalate for High–Power Surface Acoustic Wave Devices", May 1994.

A. Sakurai, et al., Jpn. J. Appl. Phys., vol. 34, Part 1, No. 5В, pp. 2674–2677, "Epitaxially Grown Aluminum Film on Rotated Y–Cut Lithium Niobate for High–Power Surface Acoustic Wave Devices", May 1995.

N. Kimura, et al., Jpn. J. Appl. Phys., vol. 36, Part 1, No. 5B, pp. 3101–3106, "The Power Durability of 900 MHz Band Double–Mode–Type Surface Acoustic Wave Filters and Improvement in Power Durability of Al–Cu Thin Film Electrodes by Cu ATOM Segregation", May 1997.

* cited by examiner

SAW DEVICE AND MANUFACTURING METHOD

BACKGROUND OF THE INVENTION

1. Field of the Invention

This invention relates to electrode materials in surface acoustic wave (SAW) devices which are required to have power durability, such as, for example, SAW filters employed in mobile phones and branching filters operable in a high-frequency band from 800-MHz band to GHz band.

2. Prior Art

Surface acoustic wave (SAW) devices, typically SAW filters and SAW resonators are prevalently utilized instead of dielectric filters as RF band filters in mobile communication equipment such as mobile phones and cordless phones. The reason is that the SAW devices, especially SAW filters have a smaller size than the dielectric filters and when devices of the identical size are compared, the former have better electrical characteristics.

The SAW device includes at least a piezoelectric substrate, a comb-shaped electrode pattern in the form of a metal film formed on a surface of the piezoelectric substrate, and a package accommodating the piezoelectric substrate and the electrode pattern. As the piezoelectric substrate, lithium niobate, lithium tantalate and rock crystal are used. Especially for RF band filters, lithium niobate and lithium tantalate are often used on account of their high electromechanical coupling constant.

Electrodes in SAW devices are generally formed of Al—Cu alloys. Especially for devices required to have power durability, an attempt was made to increase the Cu concentration of Al—Cu alloy. However, Al—Cu alloy materials having high Cu concentrations are susceptible to corrosion, especially after dry etching with chlorine gas. This prohibited consistent manufacture.

Attempts were also made to use as the electrode material Al—Ti, Al—Ta and other aluminum base alloys which are resistant to corrosion and have good power durability (see, for example, JP-B 7-107967 and JP-A 9-298442). However, these alloy materials are not applicable to high efficiency SAW devices since they have a higher electrical resistance than the Al—Cu alloys.

It was also attempted to improve power durability using a film consisting of alternately deposited layers of different metals, such as a four-layer film of titanium layers and Al—Sc—Cu alloy layers or a three-layer film of Al—Cu alloy layer and copper layer (see, for example, WO 99/54995 and JP-A 7-122961). In the case of an alternately deposited layer film for use in SAW devices operable below 1 GHz band, the thickness of aluminum alloy can be increased to 0.1 μm or greater. However, the resistivity of a thin film generally increases as the thickness decreases. Then, when the alternately deposited layer film is used as the electrode in a SAW device operable in a high-frequency band at or above 1 GHz, the total layer thickness is approximately 0.2 μm, each of the alternately deposited layers has a thickness of less than 0.1 μm, which gives an increased electrical resistance. Therefore, these structures encounter a limit in establishing high efficiency SAW devices.

When SAW devices are utilized as branching filters, power durability or tolerance is requisite. Under substantial oscillation by SAW, electrode materials having poor power durability tend to undergo migration and generate voids, hillocks and whiskers. The generation of voids causes the electrical resistance of electrode material to increase, eventually degrading the insertion loss of SAW devices. The generation of hillocks and whiskers causes shorts between electrode digits. The generation of hillocks and whiskers is believed due to local concentration of material by displacement around voids. Then by controlling the generation of voids, the generation of hillocks and whiskers can be suppressed and the increase of electrical resistance be suppressed.

WO 97/11526 discloses that the generation of voids in Al—Cu alloy is suppressed by localizing Cu atoms at grain boundaries for thereby improving migration resistance, and power durability is improved. This suggests that the migration resistance at grain boundaries must be enhanced before power durability can be improved.

Therefore, there is a demand for an electrode formed of a single crystal material which is essentially free of such weak grain boundaries.

SUMMARY OF THE INVENTION

An object of the invention is to provide a method for preparing aluminum which contains no grain boundaries at least within the range of electrode digits serving as SAW excitation electrodes as well as a SAW device prepared by the method.

In a first aspect, the invention provides a surface acoustic wave (SAW) device comprising a piezoelectric single crystal substrate and electrodes formed on a surface thereof. The piezoelectric single crystal substrate is a lithium tantalate or lithium niobate substrate which is obtained by slicing a substrate material having axes X and Y such that a plane containing axis X and perpendicular to a new axis Y obtained by rotating axis Y about axis X by an angle of 33°±9° becomes the substrate surface. Each electrode is a layered film comprising at least a titanium nitride layer on the substrate and an aluminum layer thereon.

In a preferred embodiment, the aluminum layer contains no grain boundaries.

In a preferred embodiment, the aluminum layer has a crystal face (311) which is inclined at an angle of 9°±9° with respect to the surface of the piezoelectric single crystal substrate. Alternatively, the aluminum layer has a crystal face (111).

In a preferred embodiment, each electrode further includes a metallic titanium layer between the titanium nitride layer and the aluminum layer.

In a second aspect, the invention provides a method for preparing a SAW device, comprising the steps of furnishing a lithium tantalate or lithium niobate substrate by slicing a substrate material having axes X and Y such that a plane containing axis X and perpendicular to a new axis Y obtained by rotating axis Y about axis X by an angle of 33°±9° becomes a substrate surface; sputtering and depositing titanium on the substrate surface while feeding nitrogen gas and argon gas; and sputtering and depositing pure aluminum thereon while feeding argon gas alone.

Also provided is a method for preparing a SAW device, comprising the steps of furnishing a lithium tantalate or lithium niobate substrate by slicing a substrate material having axes X and Y such that a plane containing axis X and perpendicular to a new axis Y obtained by rotating axis Y about axis X by an angle of 33°±9° becomes a substrate surface; sputtering and depositing titanium on the substrate surface while feeding nitrogen gas and argon gas; then depositing titanium thereon while interrupting the feed of nitrogen gas and feeding argon gas alone; and sputtering and depositing pure aluminum thereon while feeding argon gas alone.

ADVANTAGES

The electrode material which contains no grain boundaries within the range of excitation electrodes is either an amorphous material or a single crystal material. In general, aluminum material is unlikely to become amorphous. However, single crystal aluminum is available if a buffer material having a matched lattice is selected as the underlying single crystal substrate and aluminum is deposited on the buffer material.

On a substrate which is obtained by slicing a $LiTaO_3$ single crystal material having axes X and Y such that a plane containing axis X and perpendicular to a new axis Y obtained by rotating axis Y about axis X by an angle of 33°±9° becomes the substrate surface, titanium nitride capable of taking various crystal structures is an appropriate buffer material. When a film of aluminum is deposited on the titanium nitride, the aluminum becomes single crystal and forms an electrode film free of grain boundaries. Nevertheless, titanium nitride is not regarded appropriate for aluminum having (111) face orientation. Then, by forming metallic titanium on titanium nitride and depositing aluminum thereon, an aluminum single crystal layer having (111) face orientation is obtained.

The same propensity is found with $LiNbO_3$ single crystal. A single crystal aluminum film free of grain boundaries is obtainable by a process as used for $LiTaO_3$. Both the $LiNbO_3$ single crystal and the $LiTaO_3$ single crystal are of the rhombohedral structure and have substantially approximate lattice constants.

DESCRIPTION OF THE PREFERRED EMBODIMENTS

Figure 1:
FIG. 1 is a photomicrograph under TEM of an aluminum portion of an inventive electrode sample prepared in Example 1.

The SAW device of the invention includes at least a 33°±9° rotated Y cut, X propagating lithium tantalate ($LiTaO_3$) or lithium niobate ($LiNbO_3$) piezoelectric substrate, and a pair of interdigital or comb-shaped electrodes formed on a surface thereof. The interdigital electrodes each include a titanium nitride under-film formed on the substrate and an aluminum film formed on the titanium nitride under-film.

The piezoelectric substrate is formed of 33°±9° rotated Y-X propagating lithium tantalate or lithium niobate single crystal commonly used in the prior art. The cut orientation of the substrate employed herein for slicing a substrate material having axes X and Y is such that a plane containing axis X and perpendicular to a new axis Y obtained by rotating axis Y about axis X by an angle of 33°±9°, preferably 33°+9° becomes the substrate surface. By providing such a substrate surface and forming a buffer layer thereon, it becomes possible for an aluminum single crystal layer to epitaxially grow thereon. The cut orientation of the substrate can be confirmed by x-ray diffraction and has a crystallographic face orientation (012). This orientation plane is parallel to or at an inclination of ±9° to the substrate surface.

The size of the substrate is not critical although the substrate generally has a dimension of about 0.1 to 10 mm in the propagation direction of surface acoustic waves, a dimension of about 0.1 to 10 mm in a transverse direction and a thickness of about 0.2 to 0.4 mm when it is applied to SAW devices. It is noted that in the step of forming electrodes, a round substrate having a diameter of 3 or 4 inches is generally used, and a number of devices of the above size are simultaneously formed on the substrate.

The titanium under-film includes at least a titanium nitride film and preferably a metallic titanium film between the titanium nitride film and the aluminum film. Once titanium nitride and metallic titanium (002) under layers are formed on the (012) single crystal substrate, an aluminum layer of quality having a (311) or (111) face orientation can be epitaxially grown thereon.

The titanium nitride film preferably has a thickness in the range of 0.3 to 10 nm, more preferably 0.8 to 5 nm. As the thickness of the titanium nitride under metal film increases, internal stresses increase so that cracks and delamination may occur more frequently. Too thin a film fails to exert the function of a buffer layer.

If necessary, the metallic titanium film is formed between the titanium nitride under-film and the aluminum layer. The provision of a metallic titanium film on titanium nitride allows aluminum to epitaxially grow in (111) face orientation. The titanium film becomes more desirable as its purity increases. A titanium film with a purity of at least 99.9% is preferably used.

The titanium nitride film serving as the under layer should preferably have a graded structure. More specifically, provided that titanium nitride is represented by $TiN_x$, the titanium nitride film is preferably formed such that x decreases in a film thickness direction and to 0 at the top, that is, Ti. The thickness of the metallic titanium film should preferably be at least 1 nm in order that the film be homogeneous. The upper limit of the thickness of the metallic titanium under-film is not critical. However, the thickness is preferably up to 100 nm because the greater the thickness, the more becomes internal stresses so that cracks and delamination may occur more frequently.

The titanium nitride and metallic titanium under metal films can be deposited by any technique such as evaporation or sputtering. The titanium under metal film is preferably deposited at a rate of about 0.01 to 1 nm/sec for control of film thickness.

The vacuum chamber is preferably set at a vacuum of $1 \times 10^{-4}$ Pa or lower, and more preferably $1 \times 10^{-5}$ Pa or lower. In the vacuum chamber, an inert gas such as Ar, He, Kr, Xe or Ne is introduced as the sputtering gas. Where titanium nitride is to be deposited, nitrogen gas may be introduced as the reactant gas. By controlling the flow rate of nitrogen gas, a graded structure as described above can be established. More specifically, the process involves the steps of sputtering and depositing titanium on the substrate surface while feeding nitrogen gas and the sputtering gas such as argon gas; then depositing titanium thereon while interrupting the feed of nitrogen gas and feeding argon gas alone; and thereafter, sputtering and depositing pure aluminum thereon while feeding argon gas alone. What is needed in the process is to determine the deposition time so as to give an optimum thickness (because the thickness of the respective layers can be computed from the deposition rate), and to switch the reactant gas feed. A graded structure may be established by gradually reducing the flow rate of nitrogen gas as the reactant.

During the deposition steps, the substrate may be heated, preferably to a temperature of about 50° C. to about 200° C.

The aluminum film to be formed on the titanium underfilm can be deposited by any technique such as evaporation or sputtering. The aluminum film is preferably deposited at a rate of about 1 to 20 nm/sec.

The thickness of the aluminum film may be determined as appropriate depending on the operating frequency band and other factors.

The aluminum film formed on the under layer is an epitaxially grown single crystal film. For this reason, no grain boundaries are contained in the aluminum layer.

The aluminum film thus formed is a single crystal film having face (311) or (111) or crystallographically equivalent face. The orientation of crystal face (311) of aluminum is inclined at an angle of 9°±9° with respect to the surface of the piezoelectric single crystal substrate. The face (311) or (111) or crystallographically equivalent face of aluminum crystal can be confirmed by x-ray diffraction.

Since the (111) aluminum film has a surface given by the close-packed face, an oxide film formed thereon is dense and highly resistant to corrosion, achieving an outstanding improvement in device life.

The SAW device of the invention may be constructed as a ladder type SAW filter having a plurality of SAW resonators combined together.

EXAMPLE

Examples of the invention are given below by way of illustration and not by way of limitation.

Example 1

A 42° rotated Y-X propagating LiTaO$_3$ substrate was cleaned by ultrasonic cleaning in acetone and isopropyl alcohol (IPA) and replacing the organic solvent by pure water. The substrate was placed in a vacuum chamber of a sputtering apparatus, which was evacuated to a vacuum and preheated at 170° C. Thereafter, the substrate was transferred to a Ti depositing chamber where Ar gas and nitrogen gas were fed each at a rate of 15 SCCM to provide a pressure of 0.7 Pa within the chamber. Thereafter, a plasma was generated for sputtering a metallic titanium target. In this way, titanium nitride was deposited by reactive sputtering. The deposition rate and the deposition time were controlled so as to set the thickness of titanium nitride to 0.8 nm. Thereafter, the feed of nitrogen gas was interrupted, and the feed of argon gas was continued to deposit metallic titanium. The substrate was transferred to an Al depositing chamber where Al was deposited using Ar gas. The thickness of the layered film was measured by a fluorescent x-ray film gage meter, finding 10 nm for titanium and 330 nm for aluminum. As a comparative sample, a single layer film of Al-0.5 wt % Cu alloy was deposited on a similarly cleaned 42° rotated Y-X propagating LiTaO$_3$ substrate. This alloy film had a thickness of 347 nm.

The two aluminum films were analyzed by x-ray diffractometry for determining rocking curves of Al (111). The results are shown in Table 1. For the single layer film of Al-0.5 wt % Cu alloy, a peak was found at a position corresponding to the θ value 19.2° of Al (111), and the half-value width of the peak was 2.0°. For the titanium nitride/titanium/aluminum layered film, a peak was not found at a position corresponding to the θ value 19.2° of Al (111), but at a position of 21°, and the half-value width of the peak was 0.766°. This indicates that the Al (111) face is inclined at an angle of 2° from the substrate surface.

TABLE 1

| Sample | θ at Al(lll) peak | Al(lll) half-value width |
|---|---|---|
| Al-0.5% Cu alloy single layer film | 19.2° | 2.0° |
| TiN/Ti/Al | 21° | 0.766° |

Figure 2:
FIG. 2 is a photomicrograph under TEM of an aluminum portion of a comparative electrode sample prepared in Example 1.

The aluminum layer in the layered film was found to be a single crystal film containing no grain boundaries as seen from FIG. 1 which is a photomicrograph of the aluminum layer under a transmission electron microscope. In contrast, the Al-0.5 wt % Cu alloy film in the comparative sample was found to contain grain boundaries as seen from FIG. 2.

Figure 3:
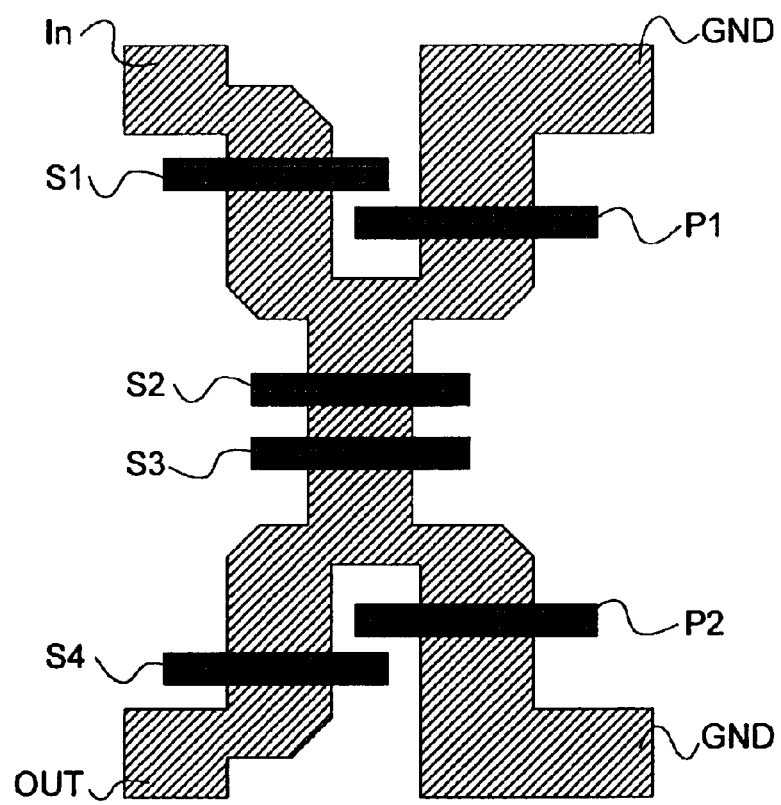
FIG. 3 is a plan view showing the outline of a ladder type SAW filter.
Figure 4:
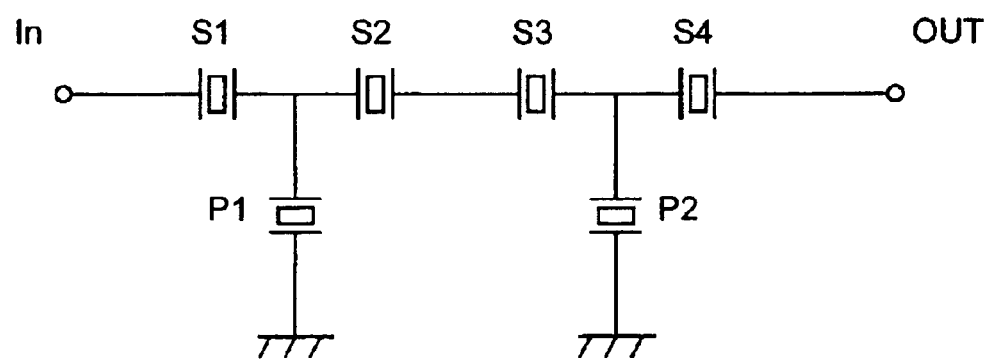
FIG. 4 is an equivalent circuit diagram of FIG. 3.
Figure 5:
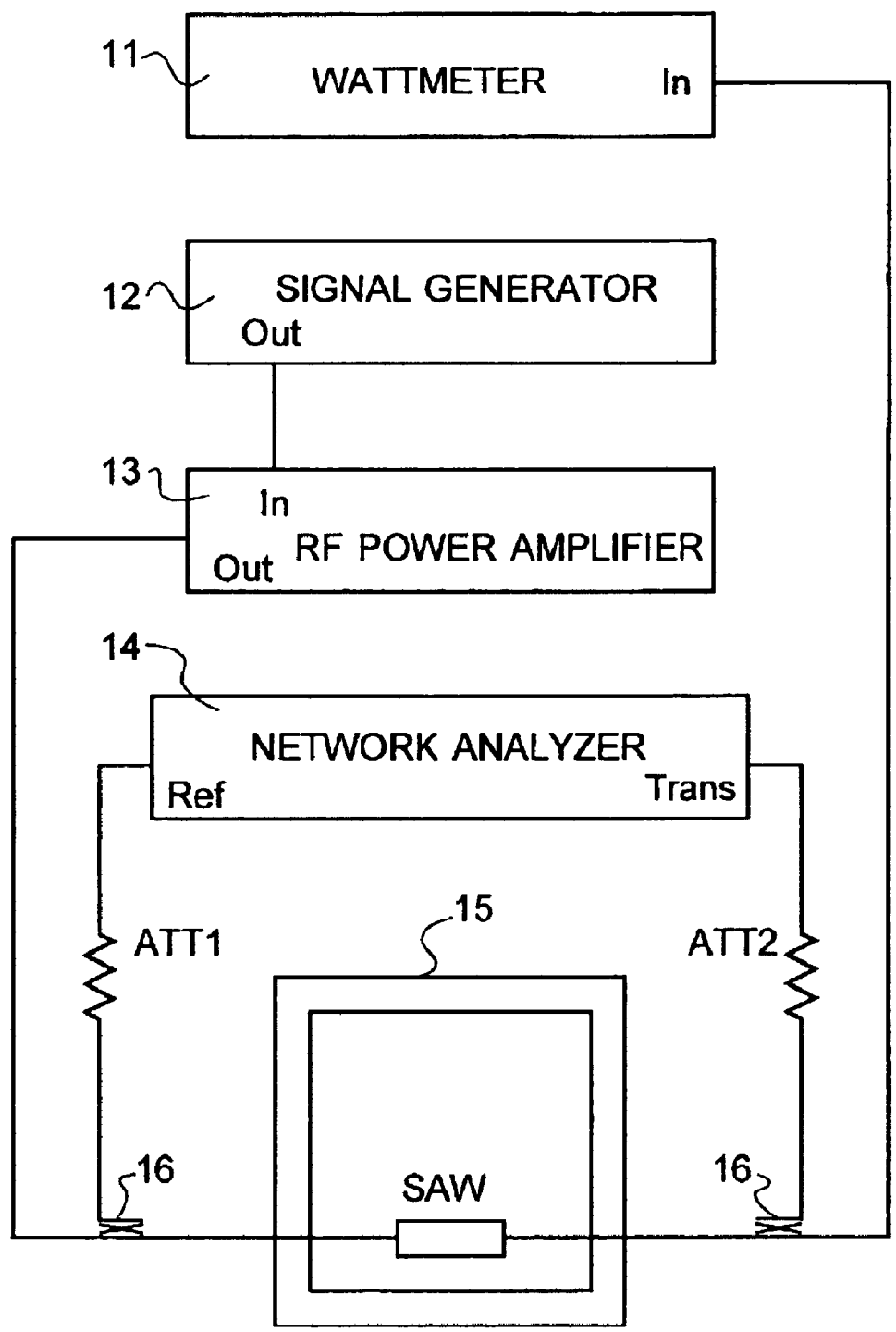
FIG. 5 is a wiring diagram showing an arrangement used for the evaluation of power durability.

Using these two films as the electrode, four-stage ladder type SAW filters were constructed as shown in FIGS. 3 and 4. FIG. 3 is a plan view showing the outline of a SAW filter, and FIG. 4 is an equivalent circuit diagram of FIG. 3. In the figures, SAW devices S1 and S2 are connected in series between an input terminal In and an output terminal Out. SAW devices P1 and P2 connect an intermediate between the SAW devices S1 and S2 and an intermediate between SAW devices S3 and S4 to the ground GND, respectively. The SAW filter of this construction was determined for power durability in a 85° C. atmosphere using a measurement instrument constructed as shown in FIG. 5. More specifically, the SAW filter is placed in a thermostat vessel 15. An RF signal within the predetermined frequency range is generated by a signal generator 12, amplified to the predetermined level by an RF power amplifier 13, and fed to the input terminal In of the filter. A wattmeter 11 is connected to the output terminal Out of the filter for measuring an output power. Between the input and the output of the SAW filter, a network analyzer 14 is connected through directional couplers 16 and attenuators ATT1, ATT2. The power durability was evaluated as a lifetime of the SAW filter operating with a power of 1.58 W until the insertion loss was degraded 2 dB. The results are shown in Table 2.

TABLE 2

| Sample | Lifetime |
|---|---|
| TiN/Ti/Al layered film | 7900 min |
| Al-0.5% Cu alloy single layer film | 30 min |

The SAW filter using the layered film as the electrodes has a lifetime which is 260 times longer than the Al-0.5% Cu alloy single layer film.

The substrate used in Example 1 was changed from the 42° rotated Y-X propagating LiTaO$_3$ substrate to a 39° rotated Y-X propagating LiTaO$_3$ substrate, and electrodes were similarly formed thereon. The rocking curve of Al (111) was measured, finding a half-value width (2θ) of 0.790°. Powder durability was similarly examined, finding substantially equivalent results.

Example 2

On a 42° rotated Y-X propagating LiTaO$_3$ substrate which was cleaned as in Example 1, titanium nitride was deposited to a preset thickness of 2.5 nm by sputtering a titanium target under a deposition pressure of 0.7 Pa while feeding argon gas and nitrogen gas each at a rate of 15 SCCM. This time, unlike Example 1, aluminum was deposited on the titanium nitride layer to a thickness of 343 nm while feeding argon gas alone.

The aluminum film was analyzed by x-ray diffractometry for determining a rocking curve of Al (311). For this layered film, the half-value width of Al (311) was 0.619°, demonstrating a single crystal film.

Using this layered film, a ladder type SAW filter as shown in FIG. 3 was constructed. Using the circuit shown in FIG. 5, the filter was examined for power durability at an ambient temperature of 85° C. The power durability was evaluated as a lifetime of the SAW filter operating with a power of 1.58 W until the insertion loss was degraded 2 dB. The results are shown in Table 3.

TABLE 3

| Sample | Lifetime |
|---|---|
| TiN/Al layered film | 7500 min |
| Al-0.5% Cu alloy single layer film | 30 min |

The SAW filter using the layered film as the electrodes according to the invention has a 250 times longer lifetime.

The substrate used in Example 2 was changed from the 42° rotated Y-X propagating LiTaO$_3$ substrate to 36° and 39° rotated Y-X propagating LiTaO$_3$ substrates, and electrodes were similarly formed thereon. The rocking curves of Al (111) were measured, finding a half-value width (2θ) of 0.573° and 0.535°. Powder durability was similarly examined, finding substantially equivalent results.

Example 3
Comparison of LiTaO$_3$ with LiNbO$_3$

Although LiTaO$_3$ single crystal substrates were used in Examples 1 and 2, equivalent results were obtained with LiNbO$_3$ crystal which is crystallographically analogous to the LiTaO$_3$ crystal. A comparison of LiTaO$_3$ and LiNbO$_3$ single crystals reveals only a difference of 0.070% in a-axis length and 0.778% in c-axis length as shown in Table 4.

TABLE 4

| | Crystal structure | a-axis | c-axis |
|---|---|---|---|
| LiTaO$_3$ | rhombohedral | 5.1530 Å | 13.755 Å |
| LiNbO$_3$ | rhombohedral | 5.1494 Å | 13.862 Å |

A 41° rotated Y-X propagating LINbO$_3$ substrate was cleaned as in Example 1. On the substrate, titanium nitride was deposited to a preset thickness of 2.5 nm by sputtering a titanium target under a deposition pressure of 0.7 Pa while feeding a mixture of argon and nitrogen gases. Aluminum was then deposited thereon to a thickness of 343 nm while feeding argon gas alone. The aluminum film was analyzed by x-ray diffractometry for determining a rocking curve of Al (311). The half-value width of Al (311) was 0.444°, which was better than in Example 2. This Al film was a single crystal film.

Therefore, Al single crystal films can be formed on not only LiTaO$_3$ single crystal substrates, but also LiNbO$_3$ single crystal substrates of analogous crystal structure.

BENEFITS OF THE INVENTION

The preparation of aluminum which contains no grain boundaries at least within the range of electrode digits serving as SAW excitation electrodes ensures to construct high efficiency, long life SAW devices experiencing no increase of electrical resistance and provide a method for manufacturing the same.

Japanese Patent Application No. 2001-289293 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A surface acoustic wave device comprising a piezoelectric single crystal substrate and electrodes formed on a surface thereof, wherein said piezoelectric single crystal substrate is a lithium tantalate or lithium niobate substrate which is obtained by slicing a substrate material having axes X and Y such that a plane containing axis X and perpendicular to a new axis Y obtained by rotating axis Y about axis X by an angle of 33°±9° becomes the substrate surface, and each said electrode is a layered fun comprising at least a titanium nitride layer on the substrate and an aluminum layer thereon, wherein the aluminum layer has a crystal face (311) which is inclined at an angle of 9°±9° with respect to the surface of said piezoelectric single crystal substrate.

2. A surface acoustic wave device comprising a piezoelectric single crystal substrate and electrodes formed on a surface thereof, wherein said piezoelectric single crystal substrate is a lithium tantalate or lithium niobate substrate which is obtained by slicing a substrate material having axes X and Y such that a plane containing axis X and perpendicular to a new axis Y obtained by rotating axis Y about axis X by an angle of 33°±9° becomes the substrate surface, and each said electrode is a layered film comprising at least a titanium nitride layer on the substrate and an aluminum layer thereon, wherein each said electrode further includes a metallic titanium layer between the titanium nitride layer and the aluminum layer.

3. The surface acoustic wave device of claim 2, wherein the aluminum layer has a crystal face (111).

4. The surface acoustic wave device of claim 2, wherein said titanium nitride film is represented by TiNx, where the titanium nitride film is formed such that x decreases in a film thickness direction and to 0 at the top, where TiNx=Ti when x=0.

5. The surface acoustic wave device of claim 2, wherein said metallic titanium film has a purity of at least 99.9%.

6. The surface acoustic wave device of claim 2, wherein said metallic titanium film has a thickness ranging from 1 to 100 nm.

7. The surface acoustic wave device of claim 2, wherein said metallic titanium film is deposited by evaporation.

8. The surface acoustic wave device of claim 2, wherein said metallic titanium film is deposited by sputtering.

\* \* \* \* \*

UNITED STATES PATENT AND TRADEMARK OFFICE
CERTIFICATE OF CORRECTION

PATENT NO. : 6,903,488 B2  
DATED : June 7, 2005  
INVENTOR(S) : Masahiro Nakano et al.

It is certified that error appears in the above-identified patent and that said Letters Patent is hereby corrected as shown below:

Title page,
Item [56], References Cited, FOREIGN PATENT DOCUMENTS,
"WO 00/54005" should read -- WO 99/54995 --;
OTHER PUBLICATIONS, "Epitaxially Grown Electrodes..." should read -- Epitaxially Grown A1 Electrodes... --; and "No. 58" should read -- No. 5B --.

Column 8,
Line 27, "fun" should read -- film --.

Signed and Sealed this

Sixth Day of December, 2005

JON W. DUDAS
*Director of the United States Patent and Trademark Office*